United States Patent [19]

Skerlos

[11] 4,163,259
[45] Jul. 31, 1979

[54] WINDOWED TUNING SYSTEM WITH SYNCHRONOUS DETECTOR

[75] Inventor: Peter C. Skerlos, Arlington Heights, Ill.

[73] Assignee: Zenith Radio Corporation, Glenview, Ill.

[21] Appl. No.: 860,505

[22] Filed: Dec. 14, 1977

[51] Int. Cl.² .................. H04N 5/44; H04N 5/50
[52] U.S. Cl. ............................ 358/191; 358/195
[58] Field of Search ............... 358/160, 191, 195, 23, 358/188; 329/50, 112, 122, 123, 124, 140; 325/418–423

[56] References Cited

U.S. PATENT DOCUMENTS

| | | | |
|---|---|---|---|
| 3,867,568 | 2/1975 | Merriweather | 358/195 |
| 3,961,266 | 6/1976 | Tanaka | 325/452 |
| 4,077,008 | 2/1978 | Rast et al. | 358/195 X |

OTHER PUBLICATIONS

National Cable Television Association:Annual Convention:Jun. 1970, *Phase Lock Applications in CATV Systems;* Switzer.

*Primary Examiner*—Howard W. Britton
*Assistant Examiner*—Aristotelis M. Psitos

[57] ABSTRACT

A television receiver includes automatic fine tuning, synchronous detection, and a "window" type tuning system. The synchronous detector has a detector oscillator which is tunable to the nominal frequency of an intermediate frequency signal derived from a received television signal. For fine tuning control, a frequency comparator receives the outputs of a fixed frequency reference oscillator and the synchronous detector oscillator and develops a control signal for locking the tuner to the frequency of a received television signal.

9 Claims, 1 Drawing Figure

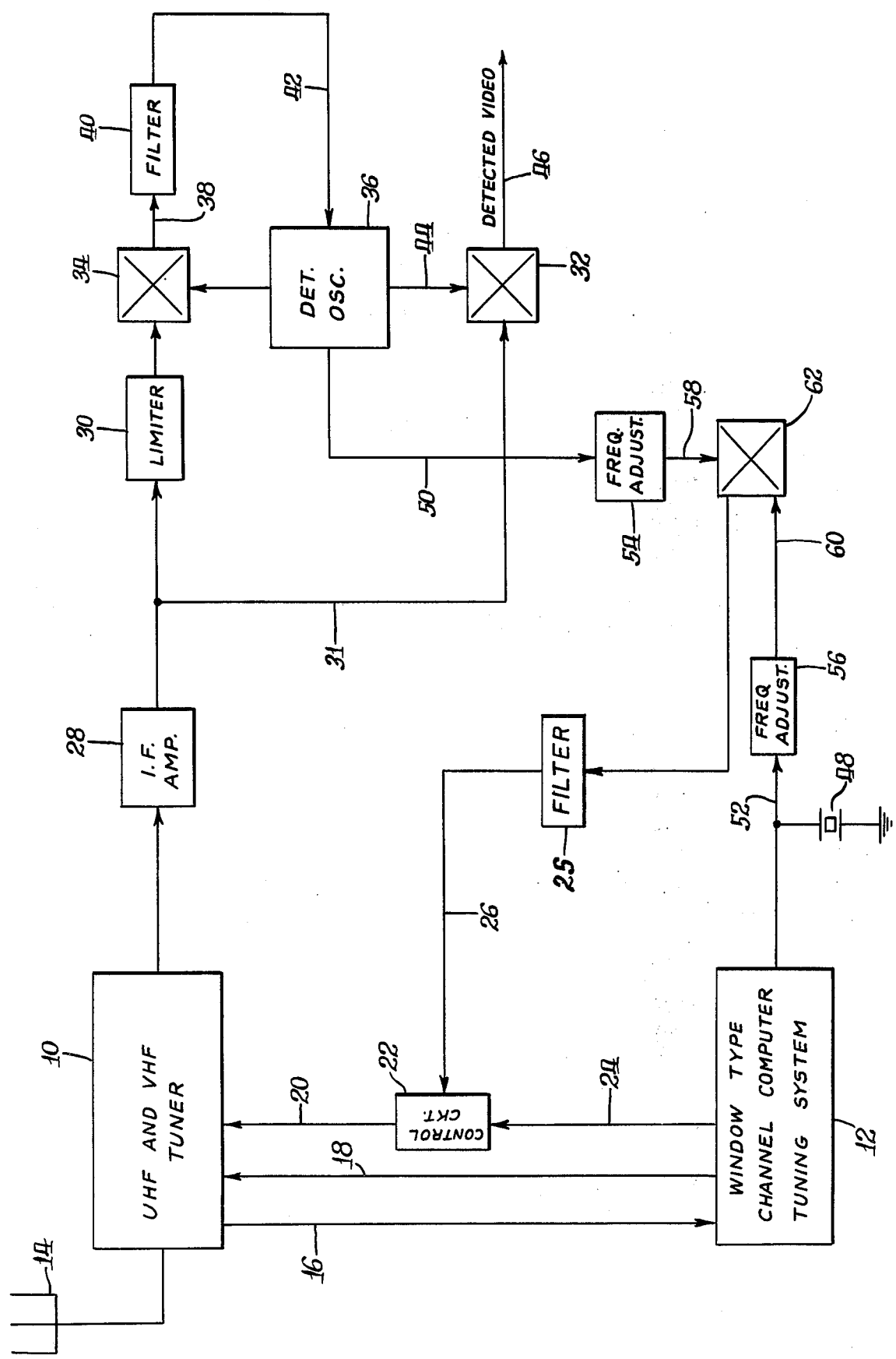

WINDOWED TUNING SYSTEM WITH SYNCHRONOUS DETECTOR

BACKGROUND OF THE INVENTION

This invention relates generally to television receivers and particularly to automatic fine tuning system for use in television receivers.

Recently, numerous systems have provided television receivers with the capability of being electronically tuned to receive any of the 83 allocated television channels. Such systems generally tune to the UHF channels as accurately and easily as to the VHF channels and is therefore highly desirable because of the FCC "equal tuning" rule.

One such system is described in U.S. Pat. No. 3,961,266 entitled "Channel Seeking Tuning System" and assigned to Zenith Radio Corporation. Briefly, that patent discloses a channel tuning system in which the number of a desired channel may be manually entered by a viewer, whereupon the receiver is automatically tuned to a restricted frequency "window" about the nominal carrier frequency of the desired channel. Upon receipt of a carrier signal within that window, a conventional AFC (automatic frequency control) system locks the tuner to the frequency of the incoming carrier.

A related improvement in high quality television receivers is in the use of so-called "true" synchronous detectors to demodulate the video components of a received signal. Such "true" synchronous detectors effectively multiply the IF (intermediate frequency) television signal by a reference oscillator signal to detect the video components. The output of the synchronous detector is a video signal having far less distortion than conventional video detectors.

In view of the present trend toward high quality television receivers and the availability of complex, yet inexpensive electronic integrated circuitry, it is desirable to provide a television receiver which enjoys the advantages of "window" tuning along with synchronous detection of the video signal.

OBJECTS OF THE INVENTION

It is an important object of the invention to provide an improved television receiver.

It is another object of the invention to provide an improved automatic fine tuning system for a television receiver.

SUMMARY OF THE INVENTION

In accordance with the invention, an improved automatic fine tuning control and synchronous detector are combined in a television receiver having a "window" type channel tuning system. A detector having a detector oscillator detects the video components of a received television signal. The synchronous detector is electronically tunable to the nominal frequency of an IF (intermediate frequency) signal derived from the received television signal. To provide automatic fine tuning control, a fixed frequency reference oscillator (used in the window tuning system) and a frequency comparator are included. The outputs of the reference oscillator and the detector oscillator are applied to the comparator such that their frequencies are equal when the detector oscillator is tuned to the nominal frequency of the IF signal. The comparator develops a control signal which is indicative of any deviation in the frequency of the detector oscillator from the nominal frequency of the IF signal. The control signal, in turn, is coupled to the receiver's tuner for locking it to the frequency of a received television carrier signal.

BRIEF DESCRIPTION OF THE DRAWINGS

The FIGURE is a schematic representation of a synchronous detection and fine tuning control system, according to the invention, for use in a television receiver. The portion of the system directed to fine tuning control is shown as coupled to a "window" type channel tuning system for locking the tuner to a received television signal.

DESCRIPTION OF THE PREFERRED EMBODIMENT

Referring now to the FIGURE, there is shown an exemplary embodiment of a synchronous detection and tuning control system which operates to demodulate a received video signal as well as to provide a control signal for tuning a television tuner 10 which is "window" tuned by a channel computer tuning system 12. The tuner 10 is preferably a UHF and VHF tuner adapted to receive incoming television signals from an antenna 14.

The tuning system 12 may be of the type disclosed in the aforementioned U.S. Pat. No. 3,961,266, the pertinent teachings of which are hereby incorporated by reference. Generally, tuning system 12 operates upon receipt of desired channel information from a viewer, as by manual operation of a keyboard, to cause tuner 10 to be tuned to a frequency window about the nominal carrier frequency of the desired channel. When a carrier signal is received within that frequency window, the automatic fine tuning control described herein locks the tuner to the frequency of the received signal.

The coupling between tuner 10 and window type channel tuning system 12 is illustrated schematically as including three functional connections comprising lines 16, 18 and 20. Briefly, line 16 couples a portion of the outputs of the VHF and UHF oscillators (not shown) in tuner 10 to channel tuning system 12. These oscillator signals constitute the tuning information from tuner 10 and are counted during a preselected interval to determine their frequency, and thus the tuning status of the tuner.

Line 18 couples a dc signal to tuner 10 to set it to a predetermined tuning range, depending on the frequency of the selected channel. For example, channels 2–4, 5–6, 7–13 and 14–83 lie in discontinuous frequency bands. The dc signal on line 18 specifies which of these frequency bands the tuner is to be operated in.

Line 20 couples a tuning control voltage to tuner 10 for accurately tuning it and locking it to the frequency of a received carrier signal. This tuning control voltage is derived from a tuning control circuit 22 (which may be as shown in FIG. 7 of U.S. Pat. No. 3,961,266) which receives a varying tuning control voltage on a line 24 from the channel tuning system. Circuit 22 passes the tuning voltage to the tuner for driving its frequency toward the center of a frequency window. Another tuning control voltage, in the form of an automatic fine tuning control voltage, is received by circuit 22 on a line 26 and applied to the tuner over line 20. This latter voltage operates to lock the tuner to the frequency of a received carrier signal which is within the frequency window.

The description above briefly describes the interaction between window type channel tuning system 12 and tuner 10, as disclosed in the U.S. Pat. No. 3,961,266. In the patent, the control voltage present on line 26 is derived from a conventional automatic fine tuning circuit, the accuracy of which is dependent on signal strength and subject to variations in temperature and humidity, among other things. Hence, the advantages of a window tuning system may not be fully exploited with conventional automatic fine tuning controls.

To take full advantage of the window tuning system and simultaneously develop a superior demodulated video signal, the conventional automatic fine tuning control is replaced herein by a more stable fine tuning control, structured in part from a synchronous video detector as will be further described.

The output of tuner 10 is coupled to a conventional IF (intermediate frequency) amplifier 28, which in turn is coupled to a limiter 30 and, via a line 31, to an in-phase detector, shown schematically as a conventional multiplier 32.

The amplitude-limited IF signal is coupled from limiter 30 to one input of a phase detector shown schematically as a conventional multiplier 34. The other input to multiplier 34 is an oscillator signal from a voltage controlled detector oscillator 36, the latter of which oscillates over a given frequency range and is tunable to the nominal frequency of the IF signal (45.75 MHz).

To vary the frequency of detector oscillator 36, multiplier 34 develops at its output lead 38 a signal indicative of the difference between the frequency of the IF signal and the detector oscillator signal. A conventional low pass filter 40 filters the output of multiplier 34 and provides a low frequency loop locking signal on its output lead 42. The locking signal adjusts detector oscillator 36 such that its frequency matches that of the received IF signal.

To synchronously detect or demodulate the IF signal, multiplier 32 receives the detector oscillator signal on lead 44 and the IF signal on lead 31. The demodulated output of multiplier 32 appears on a lead 46 and is processed in the usual manner by the television receiver.

In conventional television receivers, the frequency of the IF signal may be used as an indication of receiver tuning accuracy. Specifically, the frequency of the IF signal is 45.75 MHz when the tuner is accurately tuned to the carrier frequency of a received television signal. Any deviation from proper tuning results in the frequency of the IF signal deviating from this nominal frequency. Because the frequency of detector oscillator 36 tracks with the frequency of the IF signal on lead 31, detector oscillator 36 develops an output whose frequency is equal to 45.75 MHz when tuner 10 is properly tuned. Any detuning of the tuner is reflected in a deviation in the output frequency of detector oscillator 36 from nominal. Hence, the frequency of oscillation of the detector oscillator may be used as an indication of the accuracy of tuning of the tuner 10. As will now be described, detector oscillator 36 is used in an automatic fine tuning control loop to force the tuner to lock to the frequency of a received television signal.

Generally, the frequency of the detector oscillator is compared to the frequency of a fixed frequency or non-tunable oscillator. A control means which receives the outputs of both oscillators develops a control signal representative of the deviation of the local oscillator frequency from the nominal frequency (45.75 MHz) of the IF signal. The control signal is coupled to the tuner for locking it to the frequency of the received carrier signal.

The fixed frequency oscillator which forms a part of the automatic fine tuning control loop herein is shown schematically as a crystal oscillator 48 which preferably is the frequency reference for a clock source in the window type channel tuning system. Alternatively, oscillator 48 may be independent of the channel tuning system.

The outputs of detector oscillator 36 and reference frequency oscillator 48 are coupled via a pair of leads 50 and 52, respectively, to a control means for developing an automatic fine tuning control signal. Oscillators 36 and 48 operate at different nominal frequencies. The control means includes a first frequency adjustment means 54 and a second frequency adjustment means 56 for reducing the oscillator signal frequencies received such that the outputs of both frequency adjustment means on leads 58 and 60 are equal in frequency when the frequency of oscillator 36 is 45.75 MHz. For example, first frequency adjustment means 54 is preferably a conventional electronic frequency divider (in the form of serially connected flip-flops, for example) which receives the detector oscillator signal on lead 50 and develop an output on lead 58 which is a predetermined submultiple thereof. The first frequency adjustment means actually divides the frequency of the signal on lead 50 by 183 to provide a 250 KHz signal on lead 58 when oscillator 36 is tuned to 45.75 MHz.

If oscillator 48 operates at 250 KHz, its output need not be frequency adjusted. However, since oscillator 48 is a part of channel tuning system 12, it may operate at a frequency which is greater than 250 KHz, thereby requiring a second frequency adjustment means 56 to generate a submultiple of the frequency of oscillator 48. For the present example, it is assumed that oscillator 48 operates at 2 MHz and second frequency adjustment means 56 divides the signal on lead 52 by 8 to provide a 250 KHz signal on its output lead 60.

To compare the output frequencies of frequency adjustment means 54 and 56, a frequency comparator, in the form of a conventional multiplier 62, receives the signals on leads 58 and 60. Operating in a conventional manner, multiplier 62 develops at its output lead 26 (after filtering by a filter 25) a control signal representative of the difference in frequency between the input signals on leads 58 and 60. Because the frequency of the signal on lead 60 is constant, and the frequency of the signal on lead 58 is equal to the frequency of the signal on lead 60 only when detector oscillator 36 is tuned to the nominal frequency of the IF signal, any variation from nominal in the frequency of the oscillator will result in the control signal on the lead 26 assuming a value which tunes the tuner in a direction to reduce such variations. As the tuner becomes more accurately tuned, the frequency of the IF signal and the frequency of the detector oscillator will be closer to nominal. Once accurate tuning is attained, the frequency of the signals received by multiplier 62 will be equal in frequency. At that point, the control signal on lead 26 will cause no further adjustment of the tuner which will become locked to the received carrier signal.

Should the frequency of the received carrier signal deviate from its assigned frequency (as may happen with non-standard signal sources), the frequency of the IF signal, as well as the frequency of detector oscillator 36 will deviate from nominal, and multiplier 62 will develop an appropriate control signal for tuning the tuner to the frequency of the received carrier signal. When such tuning has been achieved, the inputs to multiplier 62 will again be equal in frequency and no further adjustments to the tuner will be made.

As shown, lead 26 is coupled to tuning control circuit 22 which passes the control signal to tuner 10 for electronically varying its tuning and for locking the tuner to the received carrier signal. Should channel tuning system 12 be constructed in accordance with U.S. Pat. No. 3,961,266, lead 26 may be coupled to the input labelled "AFC" in FIG. 7 of that patent.

Although the combined synchronous detector and fine tuning control system has been described with reference to the "window" tuning system described in U.S. Pat. No. 3,961,266, other "window" type tuning systems may also be fine tuned in accordance with this invention. In any event, the synchronous detection and fine tuning control provide a "window" tuned television receiver with enhanced fine tuning capability and a demodulated video signal of very low distortion. Significantly, both these desirable results are obtained at reduced expense by using the synchronous detector oscillator in the synchronous detection system and in the fine tuning control. Hence, the detector oscillator does "double duty".

As a further consequence of using the synchronous detector oscillator as an input to the fine tuning control system, receiver fine tuning is less dependent on received signal strength. In addition, temperature and humidity variations have much less effect on receiver fine tuning that they do with conventional fine tuning systems. As a result, high quality performance in a television receiver is provided, both in fine tuning and in the superior video signals developed.

Although the invention has been described in terms of a specific preferred embodiment, it will be obvious to one skilled in the art that many alterations and modifications may be made without departing from the spirit and scope of the invention as set forth in the claims.

What is claimed is:

1. In a television receiver having a tuner for tuning the receiver to a restricted frequency "window" about the nominal carrier frequency of a desired channel; a combined video detection and automatic frequency control system for detecting the video components of an intermediate frequency signal derived from the carrier frequency and for locking the tuner to the carrier frequency of a received television signal, comprising:
    a synchronous detector receiving the intermediate frequency signal for demodulating the video components thereof, said synchronous detector including a detector oscillator electronically tunable to a predetermined nominal frequency of intermediate frequency signal;
    a fixed frequency reference oscillator;
    control means receiving the output of said detector oscillator and the output of said reference oscillator for developing a control signal representative of the deviation of the detector oscillator frequency from the nominal frequency of the intermediate frequency signal; and
    means for coupling the control signal to the tuner for locking the tuner to the frequency of the received carrier signal.

2. A television receiver as set forth in claim 1 wherein said control means include a first frequency adjustment means receiving the output of said detector oscillator, a second frequency adjustment means receiving the output of said reference oscillator, and a comparator receiving the outputs of said first and said second frequency adjustment means for generating said control signal, said first and said second frequency adjustment means being adapted to change the frequency of their respective inputs such that their outputs to said comparator are equal in frequency when said detector oscillator is tuned to the nominal frequency of the intermediate frequency signal.

3. A television receiver as set forth in claim 2 wherein the nominal frequency of said detector oscillator is greater than the frequency of said reference oscillator, and wherein said first frequency adjustment means include a frequency divider for reducing the frequency of the detector oscillator output to the frequency of the reference oscillator input to said comparator.

4. A television receiver as set forth in claim 3 wherein said second frequency adjustment means includes a second frequency divider for reducing the frequency of the reference oscillator.

5. In a television receiver having a "window" channel tuning system for tuning the receiver to a frequency "window" centered about the nominal carrier frequency of a desired channel and having a fixed frequency reference oscillator in the channel tuning system for establishing a count time interval during which the tuner oscillator frequency is sampled for comparison with information representative of a desired channel number; a system for detecting the video components of an intermediate frequency signal derived from the carrier frequency signal and for locking the tuning system to the carrier frequency of a received television signal, comprising:
    a synchronous detector receiving the intermediate frequency signal for demodulating the video components thereof, said synchronous detector including a detector oscillator electronically tunable to a predetermined nominal frequency of intermediate frequency signal;
    frequency adjustment means receiving the output of said detector oscillator;
    a comparator having a pair of signal inputs for generating a control signal representative of the difference in frequency between signals on its said pair of signal inputs;
    means for coupling the outputs of said frequency adjustment means and said fixed frequency reference oscillator to the inputs of said comparator such that both inputs are equal in frequency when said detector oscillator is tuned to the nominal frequency of the intermediate frequency signal; and
    means for coupling the control signal to the channel tuning system for locking it to the frequency of the received carrier signal.

6. A television receiver as set forth in claim 5 wherein said frequency adjustment means reduces the frequency of said detector oscillator to the frequency of said fixed frequency oscillator.

7. A television receiver as set forth in claim 6 wherein said frequency adjustment means reduces the frequency of the signal received from said detector oscillator by a first predetermined fraction, and further including second frequency adjustment means coupled between said fixed frequency reference oscillator and said comparator for reducing the frequency of said fixed frequency reference oscillator by a second predetermined fraction such that both inputs to said comparator are equal in frequency when said detector oscillator is tuned to the nominal frequency of the intermediate frequency signal.

8. A television receiver as set forth in claim 7 wherein both said frequency adjustment means comprise electronic frequency dividers.

9. In a television receiver having a "window" channel tuning system for tuning the receiver to a frequency "window" centered about the nominal carrier frquency of a desired channel and having a fixed frequency reference oscillator in the channel tuning system for establishing a count time interval during which the tuner oscillator frequency is sampled for comparison with information representative of a desired channel number; a system for detecting the video components of an intermediate frequency signal derived from the carrier frequency signal and for locking the tuner to the carrier frequency of a received television signal, comprising:

a synchronous detector receiving the intermediate frequency signal for demodulating the video components thereof, said detector including a detector oscillator electronically tunable to a predetermined nominal frequency of the intermediate frequency signal;

a first frequency divider receiving the output of said detector oscillator for providing an output whose frequency is a predetermined submultiple of the frequency thereof;

a second frequency divider receiving the output of said fixed frequency reference oscillator for providing an output whose frequency is a predetermined submultiple of the frequency thereof, the submultiple frequencies provided by said first and second dividers being equal when said detector oscillator is tuned to the nominal frequency of said intermediate frequency signal;

a comparator receiving the outputs of said first and second dividers for generating a control signal representative of the difference in frequency of the outputs of said first and second dividers; and means for coupling the control signal to the channel tuning system for locking it to the frequency of the received carrier signal.

* * * * *